United States Patent [19]

Chang et al.

[11] Patent Number: 4,830,974
[45] Date of Patent: * May 16, 1989

[54] EPROM FABRICATION PROCESS

[75] Inventors: Chung-Chen Chang, Los Altos; Cheng C. Wu, San Jose, both of Calif.

[73] Assignee: Atmel Corporation, San Jose, Calif.

[ * ] Notice: The portion of the term of this patent subsequent to May 23, 2006 has been disclaimed.

[21] Appl. No.: 142,641

[22] Filed: Jan. 11, 1988

[51] Int. Cl.$^4$ .......................................... H01L 29/96
[52] U.S. Cl. ..................... 437/034; 437/043; 437/045; 437/052; 437/195; 437/240; 437/228; 357/23.5
[58] Field of Search ...................... 437/43, 52, 34, 240, 437/27, 28, 29, 30, 45, 70, 195, 200, 240; 357/23.5; 156/643, 644

[56] References Cited

U.S. PATENT DOCUMENTS

| 4,151,021 | 4/1979 | McElroy .............................. 437/43 |
| 4,554,729 | 11/1985 | Tanimura et al. ..................... 437/52 |
| 4,590,665 | 5/1986 | Owens et al. ....................... 357/23.5 |
| 4,642,881 | 2/1987 | Matsukawa et al. ................. 437/43 |
| 4,696,092 | 9/1987 | Doering et al. .......................... 437/5 |
| 4,697,330 | 10/1987 | Paterson et al. ..................... 437/42 |
| 4,701,776 | 10/1987 | Perlegos et al. .................... 357/23.5 |

FOREIGN PATENT DOCUMENTS

| 0131482 | 6/1986 | Japan ..................................... 437/43 |
| 0236165 | 10/1986 | Japan ..................................... 437/52 |
| 0088369 | 4/1987 | Japan ..................................... 437/43 |

OTHER PUBLICATIONS

Kiyoshi Miyasaka et al., "A 150ns CMOS 64K EPROM using N-Well Technology," 1982 IEEE International Solid-State Circuits Conference Digest of Technical Papers, Session 14, Feb. 11, 1982.
Darrell Rinerson et al., "512K EPROMs", 1984 IEEE International Solid-State Circuits Conference, Digest of Technical Papers, Session 10, Feb. 23, 1984.
William Ip et al., "256Kb CMOS EPROM", 1984 IEEE International Solid-State Circuits Conference, Digest of Technical Papers, Session 10, Feb. 23, 1984.
Koichiro Okumura et al., "A 1Mb EPROM", 1984 IEEE International Solid-State Circuits Conference, Digest of Technical Papers, Session 10, Feb. 23, 1984.
Kazuo Yoshizaki et al., "A 95ns 256K CMOS EPROM", 1985 IEEE International Solid-State Circuits Conference Digest of Technical Papers, Sess. 13, Feb. 14, 1985.
Ken Yu et al., "HMOS-CMOS—A Low-Power High--Performance Technology," IEEE Journal of Solid-State Circuits, vol. SC-16, No. 5, Oct. 1981, pp. 454–459.

Primary Examiner—Olik Chaudhuri
Attorney, Agent, or Firm—Thomas Schneck

[57] ABSTRACT

An EPROM fabrication process using CMOS N-well technology with a two polysilicon floating gate stack and a double layer of conductive lines providing a large process tolerance latitudes, a small reliable memory cell and high density. Channel stops and field oxide are formed by implanting boron ions, followed by a high temperature drive-in and oxidation cycle with a 1000–2500 Å thick nitride mask covering device areas. The floating gate stack is formed by forming a first gate oxide layer depositing a first polysilicon layer having a thickness of 2000–2600 Å, removing these layers from non-memory cell areas, growing a uniformly thick second oxide layer at 1100°–1200° C. over both the substrate and first polysilicon layer, depositing a second polysilicon gate layer and selectively etching away the layers to form first the device gates and second memory all gate from the second polysilicon layer, and then the floating gate from the first polysilicon layer using the second gate as a self-aligning mask. Metal coverage in the double layer of conductive lines is improved by rounding corners of glass and intermetal layers by means of glass reflow and planarization and wet/dry etching of the intermetal layer.

14 Claims, 5 Drawing Sheets

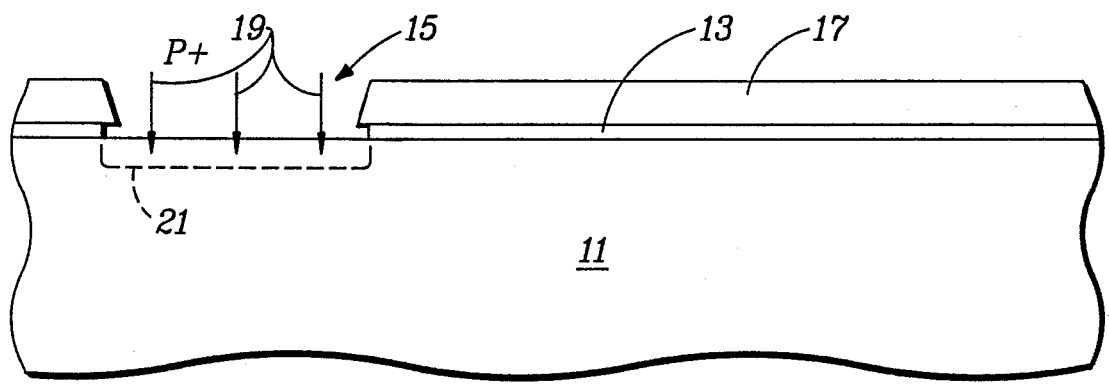
FIG._1.
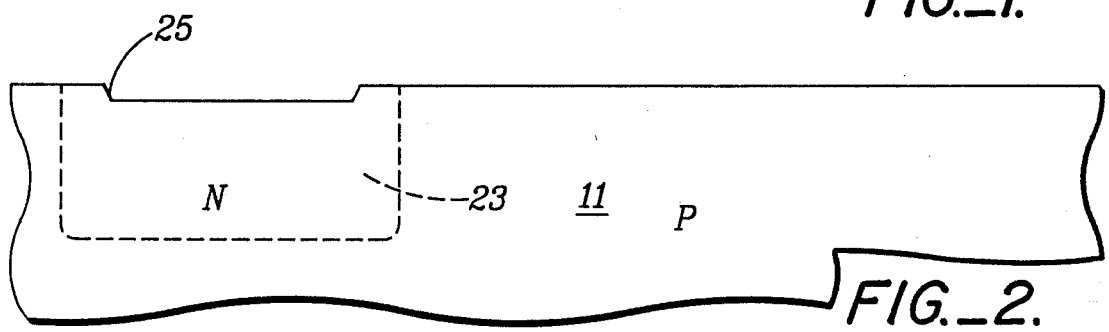
FIG._2.
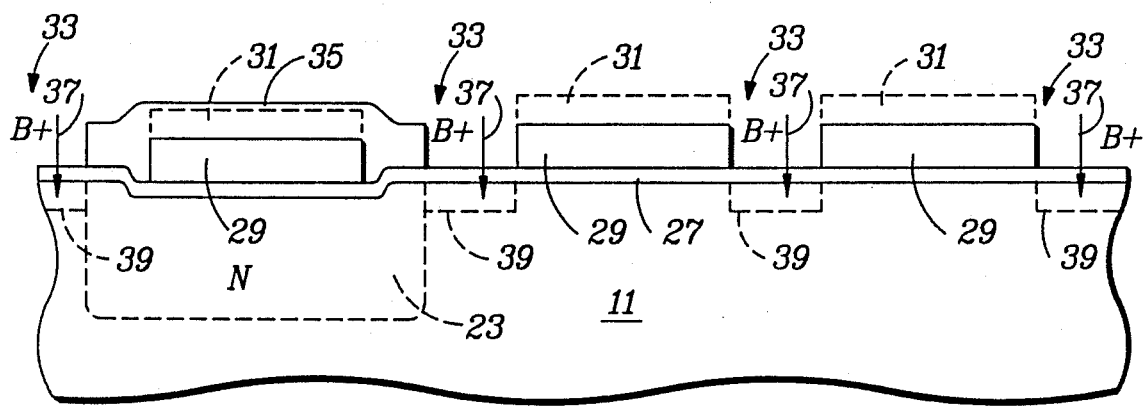
FIG._3.
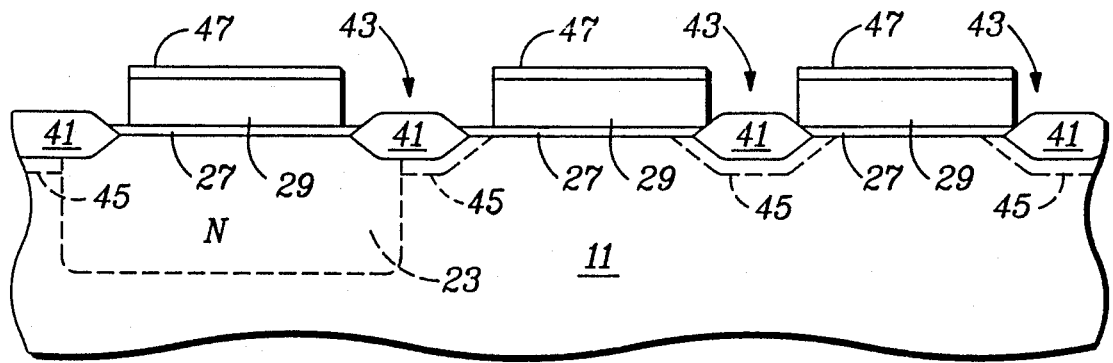
FIG._4.

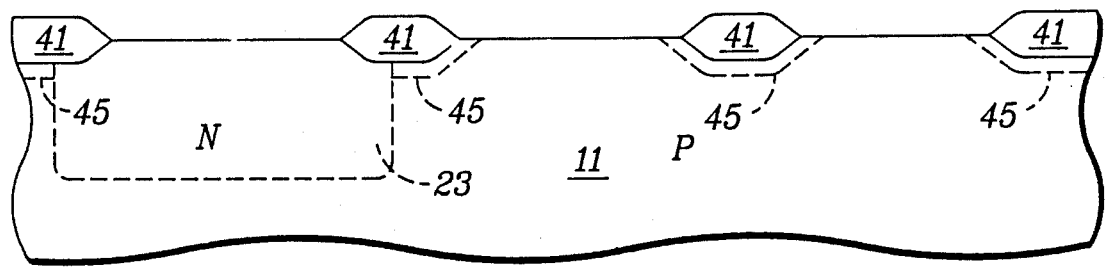
FIG._5.
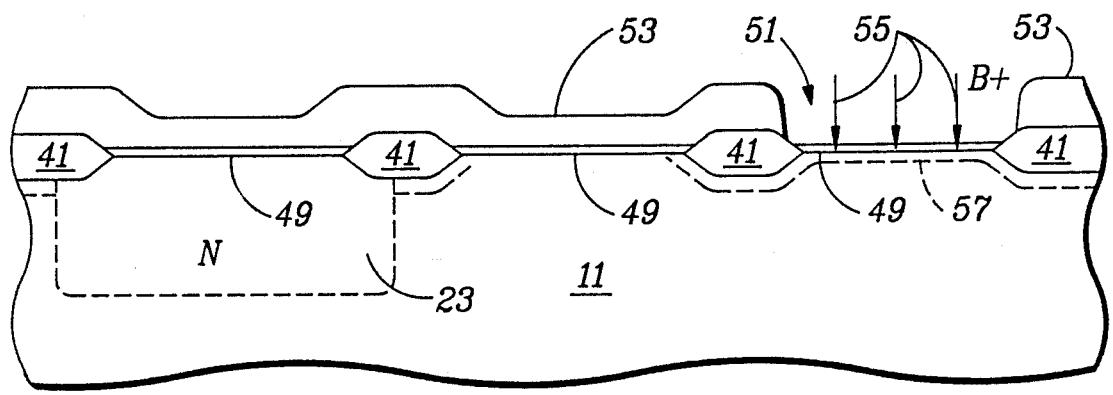
FIG._6.
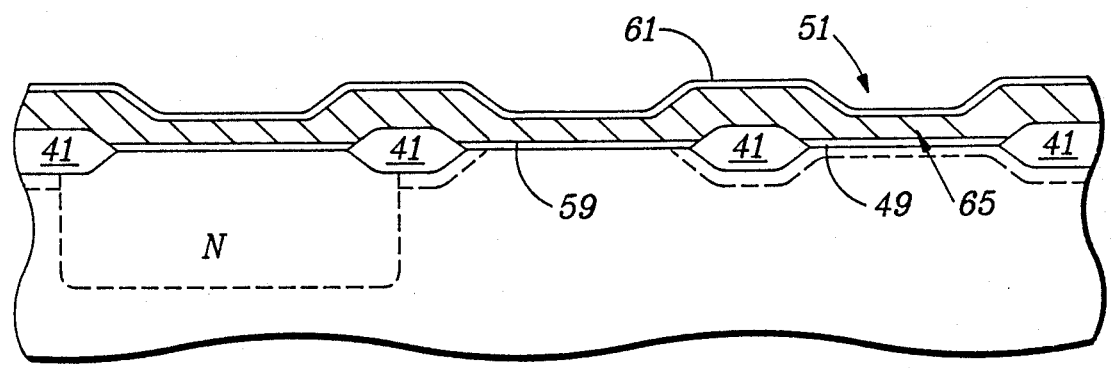
FIG._7.
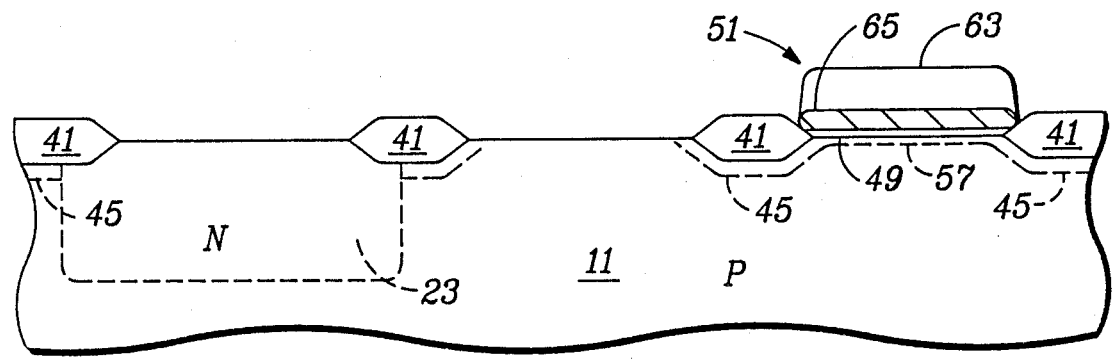
FIG._8.

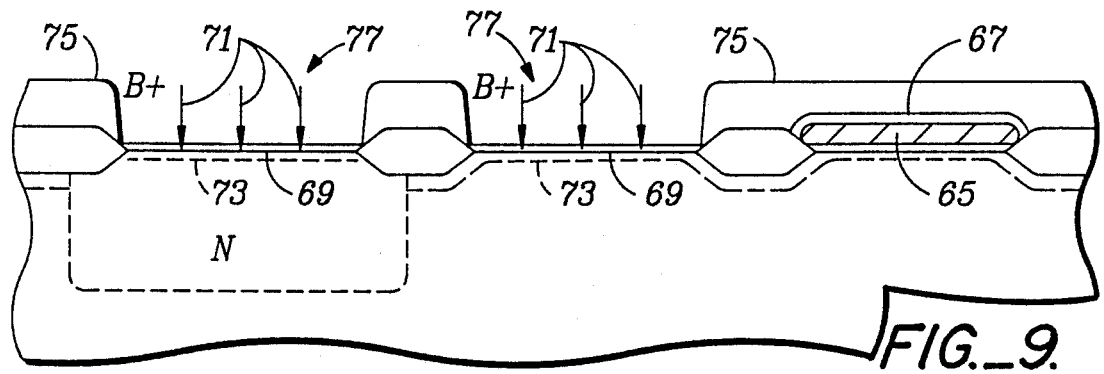
FIG._9.
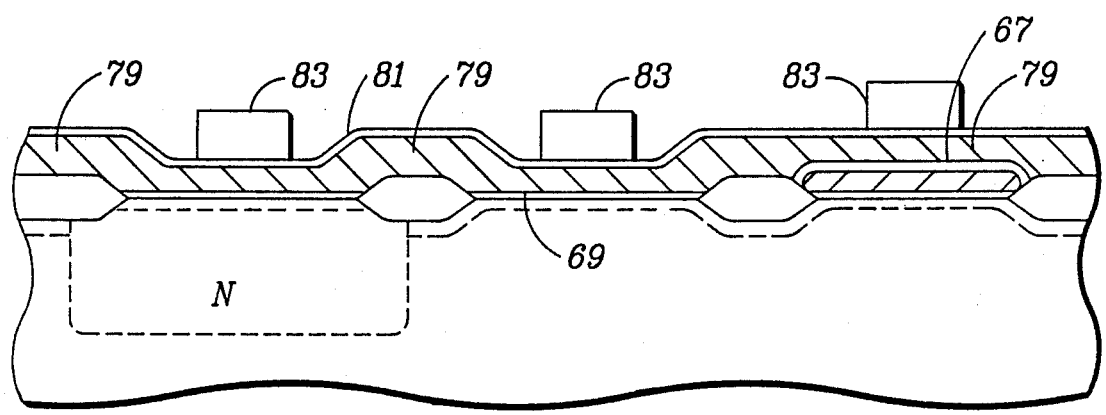
FIG._10.
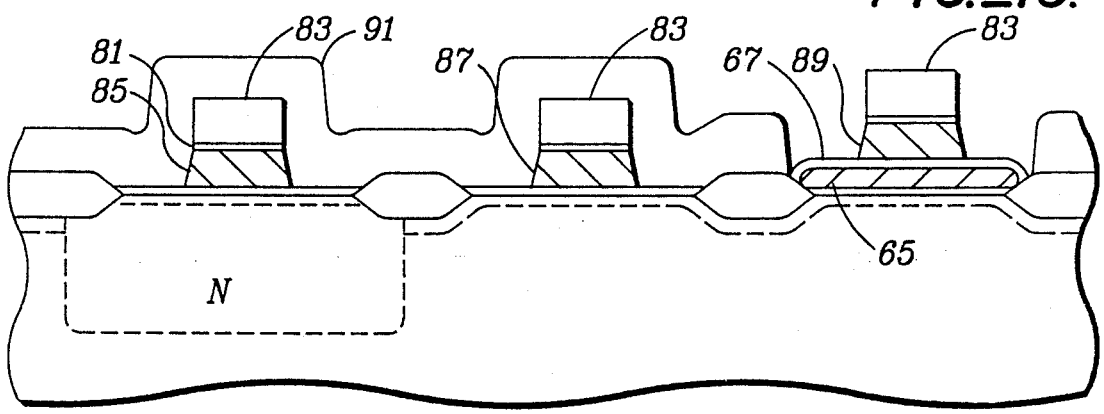
FIG._11.
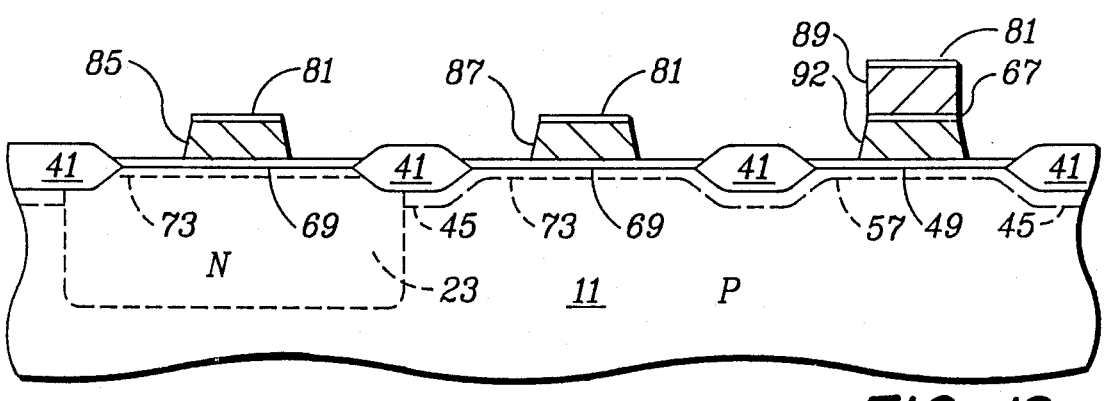
FIG._12.

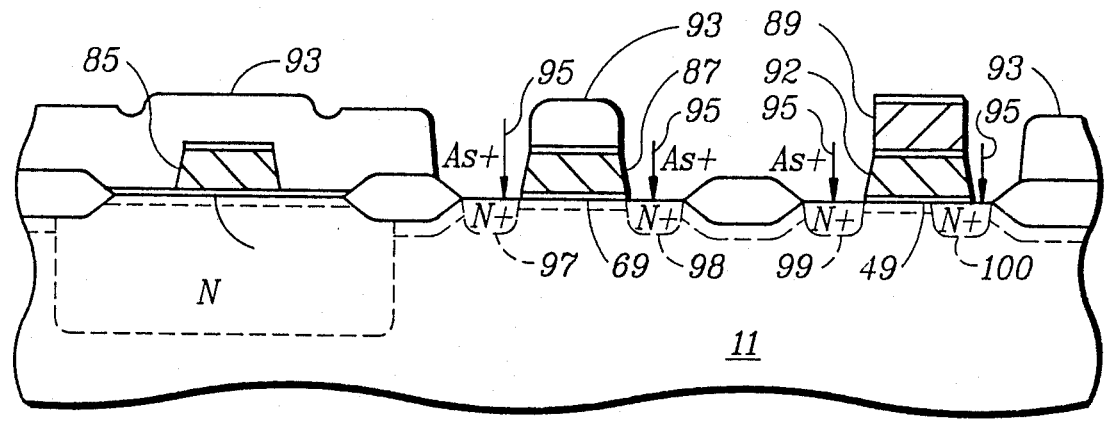
FIG._13.
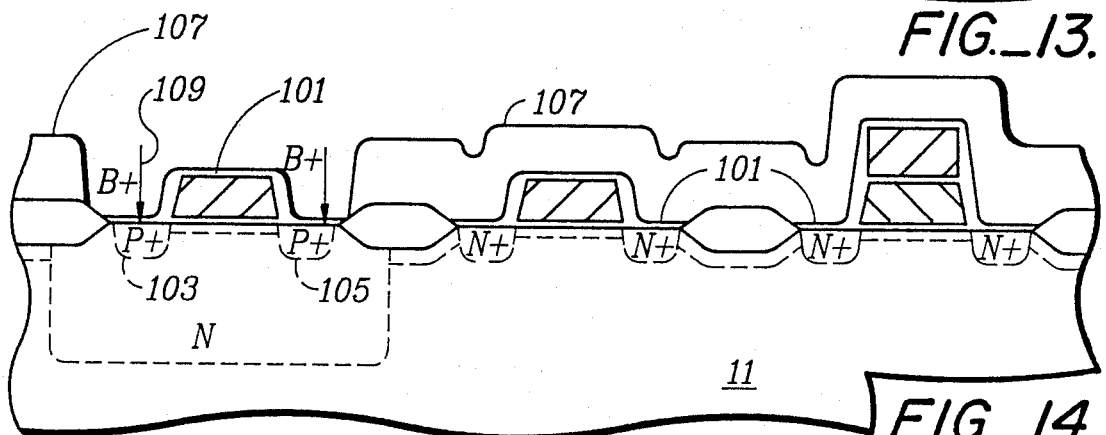
FIG._14.
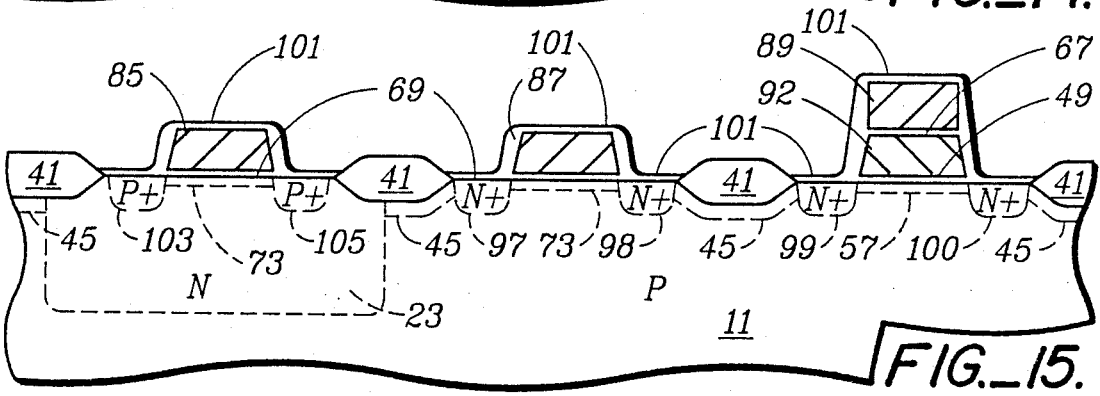
FIG._15.
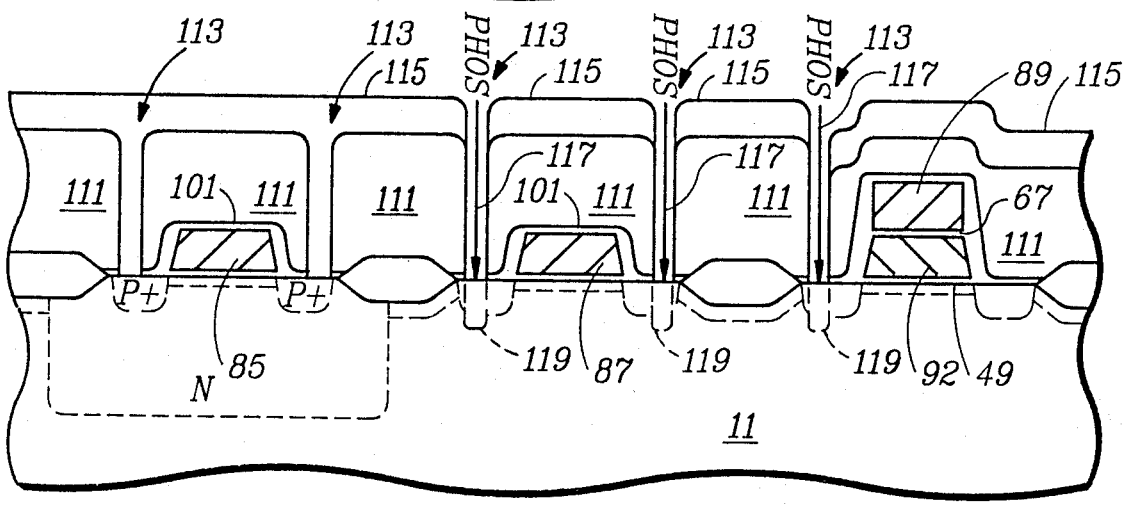
FIG._16.

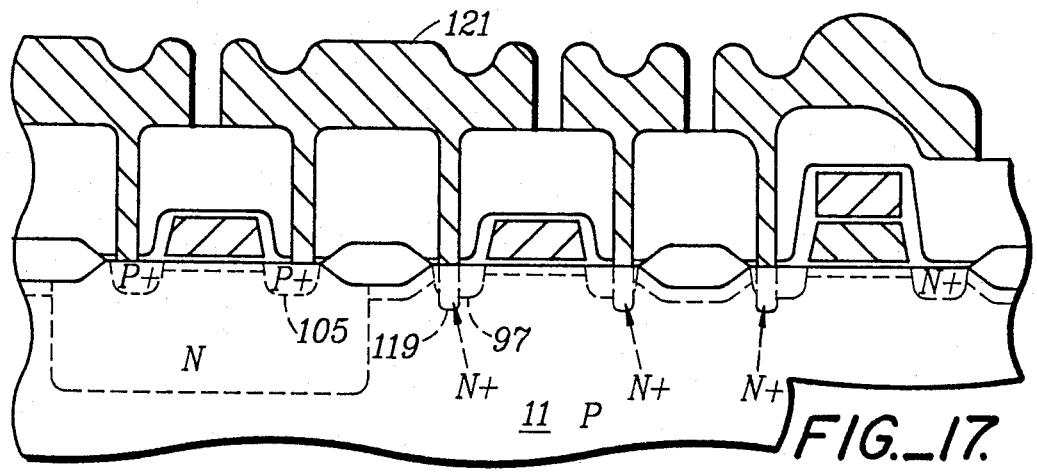
FIG._17.
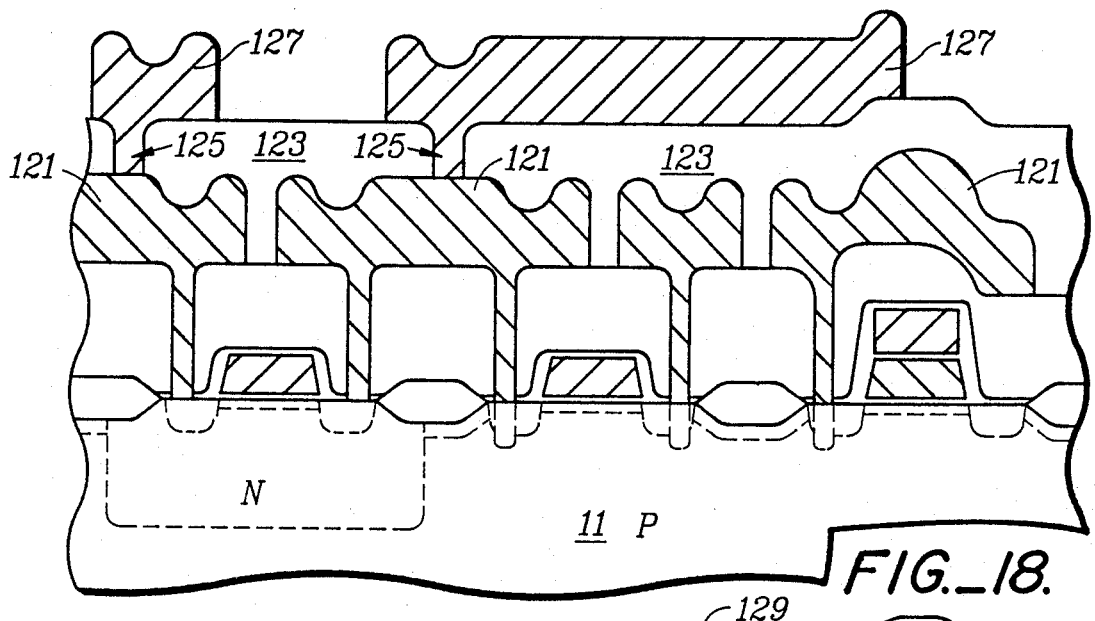
FIG._18.
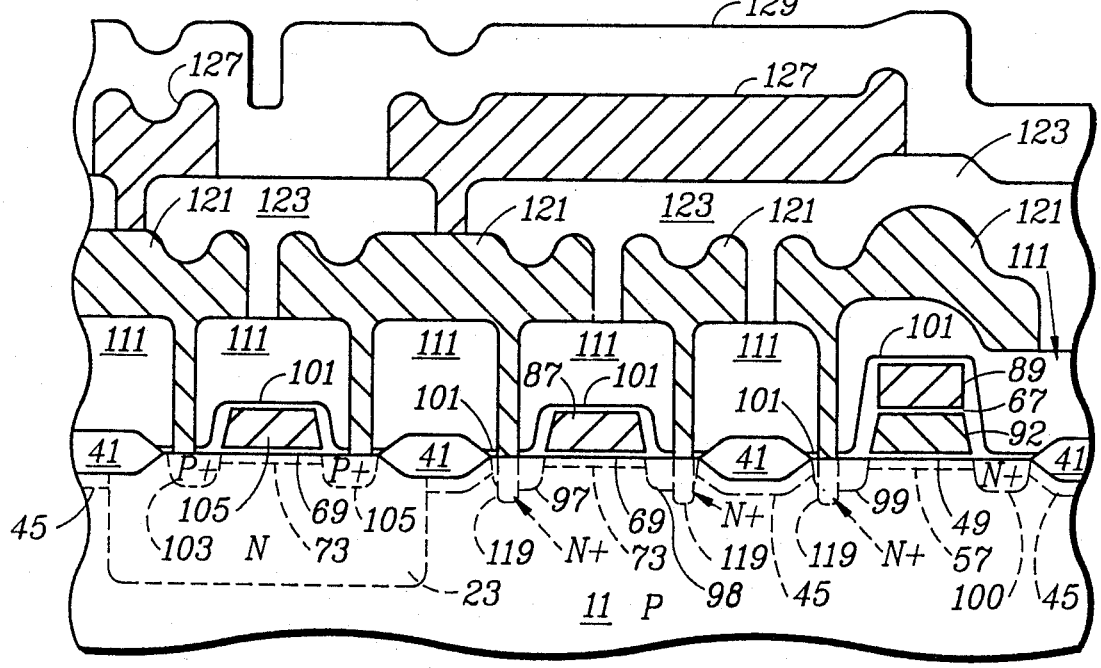
FIG._19.

EPROM FABRICATION PROCESS

TECHNICAL FIELD

The present invention relates to fabrication of erasable programmable read-only memory (EPROM) devices, and in particular to fabrication processes using complementary metal-oxide-semiconductor (CMOS) technologies.

BACKGROUND ART

Read-only memory (ROM) devices are commonly fabricated by employing metal-oxide-semiconductor (MOS) devices as the memory cells in a memory cell array. Each MOS device can be turned on by applying a voltage higher than its threshold voltage to a gate. To write into ROMs, ion implantation or other techniques are employed during fabrication to alter the threshold voltage of MOS devices representing particular memory cells. A desired program is thus stored in the ROM device. However, this method does not offer enough flexibility for most applications because the ROM is programmed in the middle of the overall fabrication process, and it typically takes from one-half to one month more to complete the rest of the process. Further, changes in the ROM program require a change in the ROM code mask used in the fabrication process.

Erasable programmable ROM (EPROM) devices are ROMs, but unlike ordinary ROM and PROM devices in which information cannot be changed once written, the information stored on EPROMs can be erased and rewritten. EPROMs use floating gate avalanche injection MOS (FAMOS) devices as the memory cells. In FAMOS devices, a floating gate, completely insulated by silicon dioxide, is placed underneath an ordinary gate. The floating gate can store charge which determines the threshold voltage and therefore the ON/OFF state of the device. A FAMOS device with its floating gate neutrally charged has a low threshold voltage and can be turned "ON" easily. As a result, the memory cell stores information "1". When electrons are injected into the floating gate through a thin insulation layer from the substrate, the floating gate becomes negatively charged. Since the floating gate is surrounded by the insulation layer, the electrons, once trapped, stay inside the floating gate during normal storage and operation conditions. A FAMOS device with a negatively charged floating gate has a higher threshold voltage, and so it stays "OFF" during normal operation. As a result, the memory cell stores information "0".

EPROMs are erased by flood exposure to ultraviolet light. Ultraviolet light with high enough energy exites the electrons to escape from the floating gates and also temporarily increases the conductivity of the gate oxide. Bathing the EPROM in the correct wavelength and intensity of ultraviolet light therefore lets the stored charge leak off the floating gates, causing the gates to return to an uncharged state. After about twenty minutes, information stored in all memory cells is completely purged. New information can then be written electrically into each memory cell.

An object of the present invention is to provide a fabrication process for EPROMs which reduces the physical dimensions of memory cell circuit elements for higher density integrated circuits.

Another object of the present invention is to provide a fabrication process for EPROMs with larger tolerance latitudes in the process so as to allow mass production of good quality EPROMs with higher yield.

DISCLOSURE OF THE INVENTION

The above objects have been met with an EPROM fabrication process using an N-well CMOS technology in which a double layer of conductive lines is formed for high performance and high density, and in which a two polysilicon floating gate stack is formed with large process tolerance latitudes to provide for a small reliable memory cell. The process, starting with a P-type substrate, begins by forming an N-well in the substrate, defining N-channel, P-channel and memory device areas and forming N-channel stops and field oxide around the device areas. Channel stops and field oxide may be formed by thermally growing a thin oxide layer, depositing a nitride layer with a thickness of 1000–2500 Å on the oxide layer and removing the nitride from non-device areas, and implanting boron ions around the N-well and N-channel device areas, then driving in the boron and thermally growing oxide in the non-device areas not covered by nitride.

The process continues by thermally growing a first gate oxide layer implant boron into memory cell area, depositing a first polycrystalline silicon ("polysilicon") layer having a thickness of 2000 to 2600 Å, and removing these layers from all areas except memory device areas. Next, a second oxide layer is thermally grown over the substrate and first polysilicon layer at a temperature of 1100° to 1200° C. This second oxide layer has a substantially uniform thickness over both the substrate and polysilicon material. After adjusting the threshold of any enhancement devices, a second gate layer, of polysilicon or of a polysilicon/silicide sandwich, is deposited and selectively removed, together with the second oxide layer, to define gates. The floating gate is then defined by selectively removing the first polysilicon layer and first gate oxide layer, using the second gate layer of the memory device as a self-aligning mask. Sources and drains are then formed using the polysilicon gates of the particular device as a self-aligning mask.

The process concludes by defining conductive lines in the following manner. First, a boron/phosphorus-doped silica glass covers the devices and gates on the wafer and contact holes to the substrate are formed. A metal layer deposited over the glass is etched to define a first layer of conductive lines. If a second layer is needed, an intermetal layer with via holes therein is formed and the second layer of conductive lines formed over the intermetal layer. Contact holes and via holes have rounded corners from reflow of the glass layer, and from planarization and wet/dry etching of the intermetal layer in order to improve metal coverage.

An advantage of the process is that a thinner floating gate and a thinner interpoly oxide layer is formed, giving a denser memory and greater reliability. Prior processes first form the floating gate, then later the second gate and use a thicker interpoly oxide layer. A thicker floating gate requires anisotropic polysilicon etching processes to prevent the first polysilicon layer from being undercut. The floating gate etched with anisotropic processes usually has a 90° edge profile, resulting in sharp corners. By employing the thinner gate, sloped etch is possible. This allows the present invention to avoid sharp corners. A thinner interpoly oxide layer has the advantage of a better coupling ratio of the voltage of the floating gate to that applied to the control gate.

This makes it possible to design smaller memory cells for denser circuits.

BRIEF DESCRIPTION OF THE DRAWINGS

FIGS. 1-19 are side sectional views of a portion of a wafer showing the process steps of the present invention for forming an N-channel device, a P-channel device and a memory cell in an EPROM.

BEST MODE FOR CARRYING OUT THE INVENTION

With reference to FIG. 1, the starting material is a P-type (100)-oriented monocrystalline silicon substrate 11 doped to a level sufficient to provide a resistivity in the range of 5-50 ohm-cm. To reduce power dissipation of circuits, a CMOS process with N-channel memory cells is employed in this invention. After extensive cleaning steps, a silicon dioxide film 13 is thermally grown to a thickness of 2000-8000 Å. The oxidation temperature of this process is about 850°-1000° C. in a steam ($H_2/O_2$) atmosphere. This oxide layer 13 is used to define an N-well area 15 with an N-well photoresist mask 17. Oxide layer 13, through regular photolithographic techniques, is etched off in N-well area 15 with a buffer oxide etchant to form a mask for the subsequent phosphorus ion implantation, indicated by arrows 19 and implant boundary 21. The implant dose level is $3-6 \times 10^{12}/cm^2$ within the implant energy range of 50-300 keV.

After the ion implantation step, the resist 17 is stripped and the wafer substrate 11 is subjected to a high temperature drive-in treatment at 1100°-1200° C. for 8-12 hours. This drive-in forms an N-well region 23, seen in FIG. 2, with a depth of approximately 3-4 $\mu$m and with a phosphorus surface concentration of about $0.7-1.9 \times 10^{16}/cm^3$. During or after N-well drive-in, a silicon dioxide film of 3000-7000 Å thickness is thermally grown at 875°-925° C. and etched to dewet to generate a silicon step 25 for alignment in the subsequent photolithographic procedures. The remaining oxide film 13 is then removed with a buffered oxide etchant (BOE), and the substrate 11 is subjected to extensive cleaning. The condition shown in FIG. 2 is the result.

With reference to FIG. 3, the substrate 11 is then subjected to an $O_2/HCl$ ambient at 900°-1000° C. to thermally grow a silicon dioxide layer 27 of 250-1000 Å thickness. On top of this oxide 27, a silicon nitride film 29 of 1000-2500 Å thickness is deposited by a low pressure chemical vapor deposition (LPCVD) method. Then, through a photolithographic step using a photoresist mask 31, this silicon nitride layer 29 is etched to define active regions. The etching is done by a plasma chemistry technique using $SF_6$ or $CF_4/O_2$ as the etchant. The silicon dioxide layer 27, grown prior to the silicon nitride deposition, assures that wafer substrate 11 is free from possible point defects or line defects, such as dislocations and subgrain boundaries, induced by the large built-in stresses ($>2 \times 10^{19}$ dyn/$cm^2$) of silicon nitride films. The thickness ratio of silicon nitride to silicon dioxide should be in the range from 1:1 to 7:1 to minimize the stress.

After removal of resist 31 and cleaning, another photolithographic step is employed in which field stop implant regions 33 are defined by a photomask 35. Photomask 35 is used principally to cover the N-well region 23 of each memory cell prior to N-channel stop formation. The channel stop is formed by implanting boron ions into the substrate 11 followed by a field oxidation cycle. Field boron implantation is indicated in FIG. 3 by arrows 37 and implant boundaries 39. The implant dose is about $1-4 \times 10^{13}/cm^2$, and an implantation energy within the approximate range of 25-50 keV is used. The reason for using a low voltage for this implantation is to prevent boron ions from penetrating through the silicon nitride layer 29 then into the substrate 11. Nitride layer 29 is generally thicker than that used in the prior art. Resist layer 35 is stripped after implantation.

Following boron implantation, a field oxidation cycle is performed. As a result of this cycle, a 0.8-1.2 $\mu$m thick field oxide layer 41, seen in FIG. 4, is grown in the isolation areas 43 using the patterned nitride layer 29, as an oxidation mask. It is desirable that the field oxide 41 and channel stop regions 45, also seen in FIG. 4, be formed at the same time. Therefore, the field oxidation cycle includes both a high temperature (1000°-1050° C.) boron drive-in step in an $N_2$ ambient and a lower temperature (900°-1000° C.) oxidation step in a steam ($H_2/O_2$) ambient. The drive-in prior to oxidation is necessary to prevent boron in stop regions 45 from being leached out in the subsequent oxidation cycles.

A thin silicon dioxide layer 47 is formed on the top of silicon nitride layer 29 during the field oxidation process, the top surface of silicon nitride layer 29 being converted to silicon dioxide due to the long hours process in the steam environment. The thickness of this silicon dioxide layer 47 is about 1-4% of the thickness of field oxide 41. Thus top oxide layer 47 needs to be removed before the silicon nitride strip. About 250-800 Å of silicon dioxide is etched off using BOE solution followed by stripping the silicon nitride layer 29 in phosphoric acid at an etch rate of 60-100 Å per minute. Lastly, the 250-1000 Å thick bottom oxide layer 27 that was under the nitride layer 29 is removed, followed by extensive wafer cleaning. The condition shown in FIG. 5 is the result.

With reference to FIG. 6, the first gate oxidation 49 is grown in an alternating $O_2/HCl$ and $O_2/N_2$ atmosphere at 750°-1100° C. The thickness of this layer 49 is about 300-350 Å. The first gate oxide 49 will be used in a memory cell area 51. A photolithographic technique using a photoresist mask 53 is applied to define the memory cell area 51. Boron is then implanted in memory cell area 51, as indicated by arrows 55 and implant boundary 57. The boron implant dose is about $1-4 \times 10^{12}/cm^2$, and the implantation energy is 30-80 keV. Mask 53 is subsequently stripped, and the wafer subjected to a cleaning procedure.

With reference to FIG. 7, a low pressure chemical vapor deposition (LPCVD) polycrystalline silicon layer 59 of 2000-2600 Å thickness, and preferably less than 2400 Å thick, is formed over the first gate oxide layer 49. The major gas used in this deposition step is $SiH_4$ (silane), and the deposition temperature is 600°-700° C. Polysilicon layer 59 is thinner than that usually found in the prior art, first polysilicon layers of the prior art generally being greater than 2600 Å thickness and typically having a thickness of above 3000 Å. Polysilicon layer 59 is doped to achieve the desired sheet resistance. Doping is by diffusion, employing $POCl_3$ or $PH_3$ (phosphine) at a temperature of 900° to 950° C. A phosphorus concentration of $10^{20}-10^{21}/cm^3$ is required to reduce the sheet resistance of polysilicon layer 59 to about 15-40 ohm/square. Phosphorus glass 61, which is formed over the polysilicon layer 59 during doping, is removed with a buffered oxide etchant.

A photoresist layer 63 is next placed on the polysilicon film 59, and using regular photolithographic techniques the first polysilicon region 65 inside the memory cell area 51 is defined. The polysilicon film 59 is then etched off the non-core regions not covered by resist 63 using a plasma etch in a reactive ion etching (RIE) mode or plasma mode. The typical plasma chemistry chosen for this step is $SF_6/CCl_4$ or $Cl_2/O_2$. After etching, resist 63 is stripped, and the oxide layer 49 is removed from all wafer areas, except for oxide underneath first polysilicon region or memory device area 65. Buffered oxide etchant is used with the polysilicon region 65 serving as a mask. The wafer is then subjected to extensive cleaning steps. The condition shown in FIG. 8 is the result before resist removal.

With reference to FIG. 9, the wafer is then subjected to a high temperature oxidation cycle to form the interpoly dielectric layer 67 as well as the gate oxide 69 for peripheral devices (both P-channel and N-channel). This second gate oxide 67 and 69 is grown in an $O_2/N_2$ atmosphere at a very high temperature of 1100°–1200° C., typically about 1135° C. The thickness of silicon dioxide layer 69 is between 310–360 Å; the thickness of layer 67 is between 400–600 Å. The reason for using very high temperatures is to achieve better control of the relative growth rate of silicon dioxide over the polysilicon gate and the monocrystalline silicon substrate. The conventional dry oxidation process, which usually uses lower temperatures of 900°–1000° C., would grow much more oxide on polysilicon than over the substrate. The $O_2/N_2$ mixture is used to reduce the oxidation rate at these very high temperatures to a reasonable and controllable rate.

To adjust the threshold voltage of enhancement devices, a boron ion implantation of dose level $7-9 \times 10^{11}/cm^2$ at 40–80 keV is employed, represented by arrows 71 and implant boundaries 73 in FIG. 9 for both P-channel and N-channel devices. Ordinary photolithographic techniques may be employed, using a photomask 75, to define areas 77 for threshold adjustment. Alternatively, implantation may take place without mask 75, mask 75 being optional, not necessary. If mask 75 is used, it is subsequently stripped after implantation.

With reference to FIG. 10, a second polysilicon film 79 is applied over interpoly dielectric layer 67 and second gate oxide 69. This LPCVD process is similar to deposition of the first polysilicon layer 59 in FIG. 7 used to form gate 65. The thickness of this second polysilicon layer 79 is 4000–5000 Å, standard for the industry. Polysilicon film 79 is doped with phosphorus to achieve a 15–30 ohm/square sheet resistance. The doping procedure is similar to that for the first polysilicon 59, described above, except that a slightly higher temperature of 950°–1000° C. is used. BOE is used to remove the phosphorus glass which is formed during the $POCl_3$ or $PH_3$ doping step. A silicide/polysilicon sandwich may replace the second polysilicon 79 in some high speed devices, the sandwich reducing the interconnect resistance and thereby improving the device speed.

A photoresist layer 83 is used as a mask to define the shape of the second polysilicon layer 79. To promote the adhesion of the photoresist 83 to the surface of the wafer, a layer 81 of silicon dioxide may be grown by surface oxidation of second polysilicon layer 79. Oxide layer 81 is optional. With photomask 83 in place, oxide layer 81, if any, and second polysilicon layer 79 are etched. Anisotropic etching is preferred. The etching chemistry chosen for this step, typically $SF_6/CCl_4$, is similar to the first polysilicon etching in FIG. 7 above. As a result of etching, polysilicon gates 85, 87 and 89, seen in FIG. 11, are defined.

With reference to FIG. 11, a second photomask layer 91 is applied over first mask layer 83 to define the floating gate area. Resist hardening is necessary for the previous mask layer 83 prior to application of the second photomask 91 to the wafer. Resist hardening can be achieved by exposing the wafer to ultraviolet light. Photoresist subjected to the ultraviolet light will be polymerized and become insoluble to a resist solvent. Either an ultraviolet lamp or a plasma of inert gases (He, $N_2$ or Ar) can be used as the ultraviolet light source. After ultraviolet light exposure, the wafer should be hard baked at high temperature (150°–200° C.). After application of mask 91 to hardened resist 83, an etch of oxide layer 67 and polysilicon layer 65 defines a floating gate 92, seen in FIG. 12. An anisotropic and highly selective etching process is required. Reactive ion etching with $CCl_4/Cl_2$ chemistry is typical. An etching profile with a positive sloped angle to the sides of the floating gate 92 is desired for better memory cell performance.

With reference to FIG. 13, to define N-channel source and drain areas, a photomask 93 is placed on the wafer. The wafer is then subjected to arsenic ion implantation, indicated by arrows 95 and arsenic N+ implant boundaries 97–100. Arsenic is implanted to a dose level of $4-6 \times 10^{15}/cm^2$ at an implantation energy of about 70–100 keV. The junction depth is about 0.4 $\mu$m after the end of the process. Note that the first and second gate oxide layers 49 and 69 are removed from the exposed areas above the implantation sites prior to implantation. After the N-channel source and drain areas 97–100 have been implanted, the resist 93 is stripped and a layer 101 of thermal oxide, seen in FIG. 14, is regrown over the areas of exposed substrate. This refill oxidation is formed at 900°–1000° C. in an $O_2$ ambient. Oxide layer 101 can fill up the cavities between polysilicon layers 89 and 92 and between polysilicon 85, 87 and 93 and substrate 11. It will also prevent device breakdown at polysilicon edges.

With reference to FIG. 14, P-channel source and drain areas 103 and 105 are defined by another photomask 107. Boron ion implantation is then carried out, as indicated by arrows 109 and implant boundaries 103 and 105, to create the source and drain. The dose is in the range of $1-3 \times 10^{15}/cm^2$, while the implantation energy is about 40–80 keV. This results in source and drain junctions about 0.6 $\mu$m deep after the end of the process. Implantation is followed by a resist strip, resulting in the condition shown in FIG. 15.

With reference to FIG. 16, a boron/phosphorus-doped silica glass (BPSG) layer 111 is next deposited on the wafer using a low pressure chemical vapor deposition technique. The concentration of boron in this glass is 2–4 wt %, while the concentration of phosphorus is about 4–6 wt %. An advantage of using BPSG over conventional PSG is that the glass flow temperature is lower for the BPSG than the PSG. A high temperature anneal step at 900°–1000° C. in alternating $H_2/O_2$ and $N_2$ ambients is employed to flow the BPSG. The thickness of BPSG layer 111 must be sufficient to cover the very high floating gate stack (Gates 92 and 89 together with oxide layers 49, 67 and 101 have a total thickness of about 8000 Å) to avoid breakdown at 20–25 Volts between gates 92 and 89 and subsequent metal contacts.

The 1.0 μm thick glass 111 is accordingly about twice as thick as that found over logic gates, which need only withstand shorting to 10 Volts.

A photomask, not shown, is placed over glass layer 111 to define contact holes 113 where metal is to make contact with the substrate 11 or the polysilicon gates 85, 87 and 89. Plasma etching or reactive ion etching can be used to form holes 113. $CHF_3/O_2$ chemistry is typically used for this purpose. Oxygen is added to avoid polymer formation, which may block further etching of the contact holes 113. After the contact hole photomask is stripped, another photomask 115 is applied to cover the P-channel contacts. The substrate 11 is then subjected to phosphorus ion implantation, indicated by arrows 117, to create N+ phosphorus plugs, indicated by implant boundaries 119, for the N-channel contacts. The dose of this implant is $2-8 \times 10^{15}/cm^2$ at an implantation energy of 50–150 keV. After implantation, resist 115 is removed.

At this point, the backside of the wafer is etched to remove the silicon dioxide and polysilicon layers which have accumulated from previous growth and deposition steps. A thick coat of negative resist, 2.0–5.0 μm thick, is applied to protect the front side of the wafer. The backside of the wafer is then subjected to buffered oxide and plasma polysilicon etching clear to the original substrate. After backside etching is completed, the protective resist coat is stripped, and the wafer is put through a regular cleaning procedure.

To improve the metal step coverage, the wafer is subjected to a heat treatment at approximately 900°–1000° C. for producing reflow of the etched BPSG layer 111. Alternating $O_2/N_2$ ambients are used for this purpose. The reflow smoothes out sharp corners at the top of holes 113. The heat also activates the plug implant doping 119. Prior to metal deposition, the substrate is subjected to a very light buffered oxide etch, so as to etch off the 300–2000 Å of silicon dioxide which is grown during the reflow process.

With reference to FIG. 17, an aluminum/silicon layer 121 is deposited on top of the wafer. The metal film 121 is about 0.6–1.2 μm thick and is 0.8–1.2% of silicon. Sputtering deposition is used, and the wafer is heated up to 200°–350° C. before sputtering deposition. Employing standard photolithographic techniques, metal connection lines are defined with a photomask, not shown, and then etched using a plasma etching method in a RIE mode. Wet and dry etching gives the connection lines curved edges for better conduction properties. The typical chemistry for the Al/Si etch is $Cl_2$, $BCl_3$ and $O_2$. An additional $CF_4$ plasma post-treatment will be helpful to avoid metal corrosion. Resist is then removed. For example, in FIG. 17 the source or drain 105 of a P-channel device is connected by metal connection lines 121 to a source or drain of an adjacent N-channel device defined by implant 97 and plug 119.

With reference to FIG. 18, for high speed devices, a double metal process is applied. An intermetal layer 123 of oxynitride, phosphorus-doped silica glass (PSG) or both is deposited over first metal layer 121. The thickness of this layer is about 6000–14000 Å. A planarization process is used to improve coverage in the subsequent second metal step. Etchback and redeposit is the technology used for this purpose. A 60–90% etchback plus redeposit to the desired thickness usually can achieve a reasonably flat wafer surface. Intermetal connect via holes 125 are defined by a photomask, followed by a wet and dry plasma/reactive ion etch and resist strip.

After a predeposition back sputter etching of the wafer, a second metal layer 127 is sputtering deposited over glass layer 123. The second metal lines are defined in the same manner as the first metal lines, i.e. by means of a photomask and plasma RIE-mode etching. In order to stabilize the surface stakes between metal 121 and 127 and substrate 11, the wafer is annealed at approximately 380°–420° C. in an $N_2/H_2$ ambient. This process, known as the "alloy process", also serves to alloy the deposited aluminum to the silicon substrate for a good ohmic contact.

With reference to FIG. 19, a passivation layer 129 is deposited over the second metal layer 127, or for single metal layer devices, over the metal layer 121. Passivation layer 129 comprises a sandwich of oxynitride and phosphorus-doped silica glass (PSG). To form passivation layer 129, PSG is deposited on the wafer by applying an atmospheric pressure chemical vapor deposition technique in silane and oxygen phosphine gases. The concentration of phosphorus in the glass is about 3–4 wt %. and the thickness of this PSG layer is about 0.6–1.2 μm. The oxynitride is deposited over the PSG by using a plasma enhanced chemical vapor technique. The thickness of oxynitride is about 2000–8000 Å with refractive index approximately 1.69–1.74. The resulting passivation layer 129 protects the fabricated integrated circuit on the wafer from moisture and contaminations.

Standard photolithographic techniques are employed to define pad openings, not shown, for probing as well as wire bonding. The oxynitride is plasma etched, while the PSG is etched with a wet oxide etching solution to open these pad areas. After removing the pad mask, a thick negative photoresist coating, 4–10 μm thick, is applied to cover the front side of the substrate. The substrate is then subjected to a backgrinding operation. The final thickness of the wafer is about 500–600 μm. Following resist removal procedures, the wafer is subjected to a light etch in buffered oxide etchant 0.8–1.2% in concentration until the backside is dewet to prepare the backside of the substrate for chrome-gold or gold deposition. After chrome-gold deposition, the device on the substrate is exposed to ultraviolet light to erase or eliminate any possible charging up during the process, and given an electrical test in a probe assembly. The final device is seen in FIG. 19.

We claim:

1. An EPROM fabrication process comprising,
    forming N-channel and P-channel MOS devices in a wafer substrate, said MOS devices having gates, sources and drains associated therewith,
    forming at least one memory cell device in said wafer substrate, said memory cell device having a floating gate and a second gate above said floating gate,
    depositing a covering of boron and phosphorus doped silica glass over said MOS and memory cell devices,
    forming contact holes in said covering leading to selected sources, drains and gates of said MOS and memory cell devices,
    heating said glass covering to a flow temperature to reflow said glass and to round the corners of said contact holes,
    depositing a first layer of conductive material over said covering, said material filling said contact holes,
    selectively etching said first layer to form first conductive lines, forming a first layer of electrically insulative material over said first conductive lines, said insulative layer being formed with a substantially planar surface, forming via holes in said insulative layer to selected first conductive lines, depositing a second layer of conductive material over said insulative layer, said material filling said via holes, and selectively etching said second layer to form second conductive lines.

2. The process of claim 1 wherein forming said insulative layer with a substantially planar surface comprises, depositing a layer of insulative material on said first conductive lines, etching back 60% to 90% of said insulative material, and redepositing said insulative material to a thickness in a range from 6000 Å to 14000 Å.

3. The process of claim 1 wherein said covering of boron- and phosphorus-doped glass has a concentration of from 2 to 4 wt. % boron and from 4 to 6 wt. % phosphorus and has flow temperature of approximately 900°–1000° C.

4. The process of claim 1 wherein said insulative material is selected from the group consisting of oxynitride, phosphorus-doped silica glass, and a combination of both oxynitride and phosphorus-doped silica glass.

5. The process of claim 1 wherein forming said at least one memory cell device comprises, thermally growing a first gate oxide layer over said wafer substrate, depositing a first polysilicon layer over said first gate oxide layer, said first polysilicon layer having a thickness in the range from 2000 to 2600 Å, thermally growing a second oxide layer over said first polysilicon layer, depositing a second polysilicon layer over said second oxide layer, selectively removing said second polysilicon layer and said second oxide layer so as to define a memory cell gate, and selectively removing said first polysilicon layer and said first oxide layer using said memory cell gate as a self-aligning mask so as to define a floating gate.

6. The process of claim 1 wherein forming via holes in said insulative layer comprises selectively etching said via holes using a wet and dry plasma reactive ion etch.

7. An EPROM fabrication process comprising, forming an N-well in a P-type wafer substrate, defining N-channel, P-channel and memory device areas in said substrate, said P-channel device areas being defined in said N-well, forming N-channel stops and field oxide around said device areas, thermally growing a first gate oxide layer over said wafer substrate, depositing a first polycrystalline silicon layer over said first gate oxide layer, said first polycrystalline silicon layer having a thickness in the range from 2000 to 2600 Å, removing said first gate oxide layer and said first polycrystalline silicon layer from all areas of said wafer substrate except said memory device areas, thermally growing a second oxide layer over said first polycrystalline silicon layer and said wafer substrate, said second oxide layer being formed at a temperature in the range from 1100° to 1200° C. to a thickness in a range from 400 Å to 600 Å over said first polycrystalline silicon layer and in a range from 310 Å to 360 Å over said wafer substrate, introducing a threshold adjusting dopant into selected N-channel and P-channel device areas, depositing a second gate layer over said second oxide layer, selectively removing said second gate layer and said second oxide layer for defining N-channel device, P-channel device and memory device control gates, selectively removing said first polycrystalline silicon layer and said first gate oxide layer from all areas of said memory device area except under said memory device gate so as to define a floating gate, forming sources and drains for said device, depositing a covering of boron and phosphorus doped silica glass on said wafer forming contact holes therein and heating said glass to a flow temperature, said contact holes in said glass being formed with rounded corners, forming first conductive lines on said glass, said lines connecting to selected sources, drains and gates via said contact holes, and forming a second layer of conductive lines connecting to selected sources, drains, gates and first conductive lines, said first conductive lines on said glass and said second layer of conductive lines being separated by an intermetal layer with a substantially planar surface and with via holes therein, said via holes having rounded corners.

8. The process of claim 7 wherein said second gate layer is formed of polycrystalline silicon.

9. The process of claim 7 wherein said second gate layer is formed of polycrystalline silicon and silicide sandwich for high speed operation.

10. The process of claim 7 wherein forming said N-channel stops and field oxide comprises, thermally growing thin silicon dioxide layer with a thickness in the range from 250 to 1000 Å on said substrate, depositing a silicon nitride layer with thickness in the range from 1000 to 2500 Å on said silicon dioxide layer, the thickness ratio of silicon nitride to silicon dioxide being in the range from 1:1 to 7:1, removing said silicon nitride from all areas of said wafer except said device areas, implanting boron ions into said substrate around N-channel device areas and around said N-well, the implantation energy being the range from 25 to 50 keV, and driving in said boron ions and thermally growing oxide in all areas except said device areas covered by said nitride, and removing said nitride layer and said thin silicon dioxide layer.

11. The process of claim 7 wherein said first gate oxide layer has a thickness in a range from 300 to 350 Å.

12. The process of claim 7 wherein said boron and phosphorus doped silicon glass has a concentration of from 2 to 4 wt % boron and from 4 to 6 wt % phosphorus, said glass having a flow temperature of approximately 900°–1000° C.

13. The process of claim 7 wherein said intermetal layer is formed by depositing a layer of insulative material on said first conductive lines, etching back 60% to 90% of said insulative material, and redepositing said insulative material to a thickness in a range from 6000 Å to 14000 Å.

14. The process of claim 7 wherein said via holes in said intermetal layer are formed by selective etching using a wet and dry plasma reactive etch.

* * * * *